(12) United States Patent
Tang et al.

(10) Patent No.: US 6,477,023 B1
(45) Date of Patent: Nov. 5, 2002

(54) ELECTROSTATIC DISCHARGE PROTECTION APPARATUS

(75) Inventors: Tien-Hao Tang, Taipei Hsien (TW); Shiao-Shien Chen, Chung-Li (TW); Chen-Chung Hsu, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 83 days.

(21) Appl. No.: 09/615,032

(22) Filed: Jul. 12, 2000

(51) Int. Cl.$^7$ .................................................. H02H 9/00
(52) U.S. Cl. ...................... 361/56; 361/91.1; 361/111; 361/118
(58) Field of Search .......................... 361/56, 91.1, 111, 361/118, 127, 58

(56) References Cited

U.S. PATENT DOCUMENTS 4,807,080 A * 2/1989 Clark ........................... 361/56
4,855,257 A * 8/1989 Kouda ........................ 437/194

* cited by examiner

Primary Examiner—Stephen W. Jackson
(74) Attorney, Agent, or Firm—J.C. Patents

(57) ABSTRACT

An electrostatic discharge protection apparatus. A drain region is formed under a pad. A gate is formed at a periphery of the pad, while a source region is formed at a periphery of the gate. Another kind of electrostatic discharge protection apparatus is also presented with a drain region formed under a pad. More than one gate is formed at a periphery of the pad, and each gate is surrounded with a source region. Further in the invention, an electrostatic discharge protection apparatus is further presented with a P-type and N-type drain region located under a pad. A first gate and a second gate are formed at a periphery of pad corresponding thereto, respectively. In the above manners, the layout of the electrostatic discharge protection can be highly packed, that is, the occupied area is greatly reduced.

11 Claims, 2 Drawing Sheets

ELECTROSTATIC DISCHARGE PROTECTION APPARATUS

BACKGROUND OF THE INVENTION

1. Field of the Invention

The invention relates in general to an electrostatic discharge (ESD) protection apparatus. More particularly, this invention relates to a layout of an electrostatic discharge apparatus that occupies a greatly reduced area compared to the area occupied by the conventional electrostatic discharge protection apparatus.

2. Description of the Related Art

In a fabrication process of an integrated circuit (IC) such as a dynamic random access memory (DRAM) or a static random access memory (SRAM), or after the chip is fabricated, the electrostatic discharge is the major cause to damage the integrated circuit. For example, when a human being walking on a blanket, in an environment with a high relative humidity (HR), the human being may carry from hundreds to thousands of electrostatic voltages. When the relative humidity is low, more than ten thousand of electrostatic voltages may be carried. In case the carried electrostatic charges are in contact with the chip, the chip is easily damaged to malfunction. To avoid the electrostatic discharge damage, various electrostatic protection methods or apparatus are developed. A very common type of electrostatic protection is to design an on-chip electrostatic discharge protection circuit between the internal circuit and each pad.

However, as the size of the integrated circuits reduces as the increase of the integration, the breakdown voltage of the gate oxide is approaching the junction breakdown voltage of the source/drain region, or even lower. The performance of the electrostatic discharge protection circuit is thus greatly deteriorated. In addition, the internal circuit is typically designed according to the minimum design rules without a proper design to withstand a huge electrostatic discharge transient current. For example, the space between the contact window and the edge diffusion region and between the contact window and the edge of the gate is designed insufficiently large. Under a high integration, the chip is easily to be damaged by the electrostatic discharge. Therefore, the electrostatic discharge has become a major cause to damage the deep sub-micron integrated circuit.

In addition to the consideration of the performance in electrostatic discharge protection, to increase the density of circuit layout, that is, to form the electrostatic discharge protection apparatus in a smaller area is also an important topic for modern integrated circuit design.

SUMMARY OF THE INVENTION

The invention provides an electrostatic discharge (ESD) protection circuit layout comprising a pad, a drain region, a gate and a source region. The drain region is located under the pad. The gate is formed at a periphery of the pad. The source region is located to surround the gate.

The electrostatic discharge protection apparatus provided by the invention comprises a pad, a drain region, multiple gates and multiple source regions. The drain region is located under the pad. The gates are surrounding the pad. Each source region is formed at a periphery of a corresponding gate.

The invention further provides another electrostatic discharge protection apparatus that comprises pads, a P-type drain region, an N-type drain region, a first gate, a second gate, a P-type source region and an N-type source region. The P-type drain region and the N-type drain region are located under the pad. The first gate is located at a periphery of a pad corresponding to the P-type drain region. The P-type source region is surrounding the first gate and the N-type source region is surrounding the second gate.

Thus design, the area of the wafer used for forming the electrostatic discharge protection is greatly reduced. It is thus applicable for devices with a more compact structure, such as the integrated circuit with a linewidth of deep submicron.

Both the foregoing general description and the following detailed description are exemplary and explanatory only and are not restrictive of the invention, as claimed.

DESCRIPTION OF THE PREFERRED EMBODIMENTS

The conventional electrostatic discharge protection apparatus, as introduced as above, occupies or waste a measurable size of area that restrict the layout or circuit design for device, especially in integrated circuit. The invention provides three embodiments that form the electrostatic discharge protection apparatus on an area that is greatly reduced from the area occupied by the conventional electrostatic discharge protection apparatus.

Figure 1:
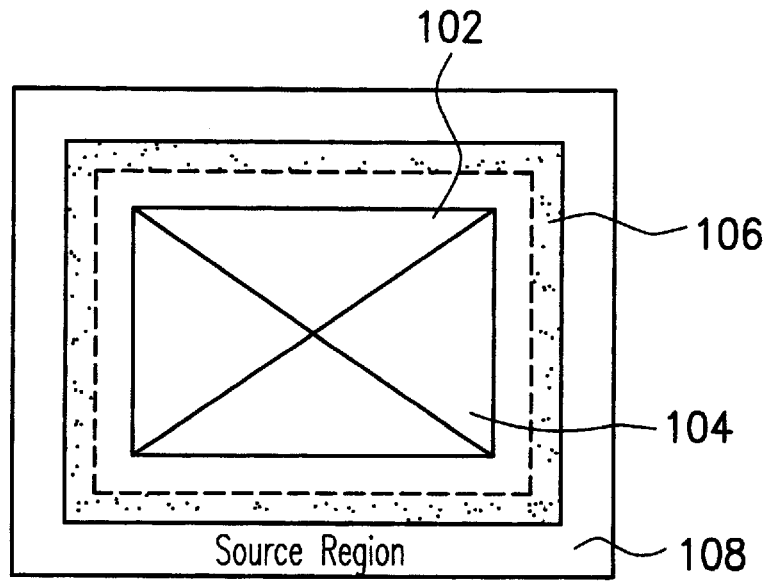
FIG. 1 is a top view of an electrostatic discharge protection apparatus in a first embodiment according to the invention.

In FIG. 1, a layout of an electrostatic discharge protection apparatus is illustrated. The electrostatic discharge protection apparatus 100 comprises a pad 102, a drain region 104, a gate 106, for example, a polysilicon gate, and a source region 108. The drain region 104 is buried by the pad 102. That is, the drain region 104 is formed under the pad 102. The source region 108 is located at a periphery of the gate 106.

In FIG. 1, the drain region 104, the gate 106 and the source region 108 together are equivalent to a transistor. The transistor can be either an NMOS transistor or a PMOS transistor.

Figure 2:
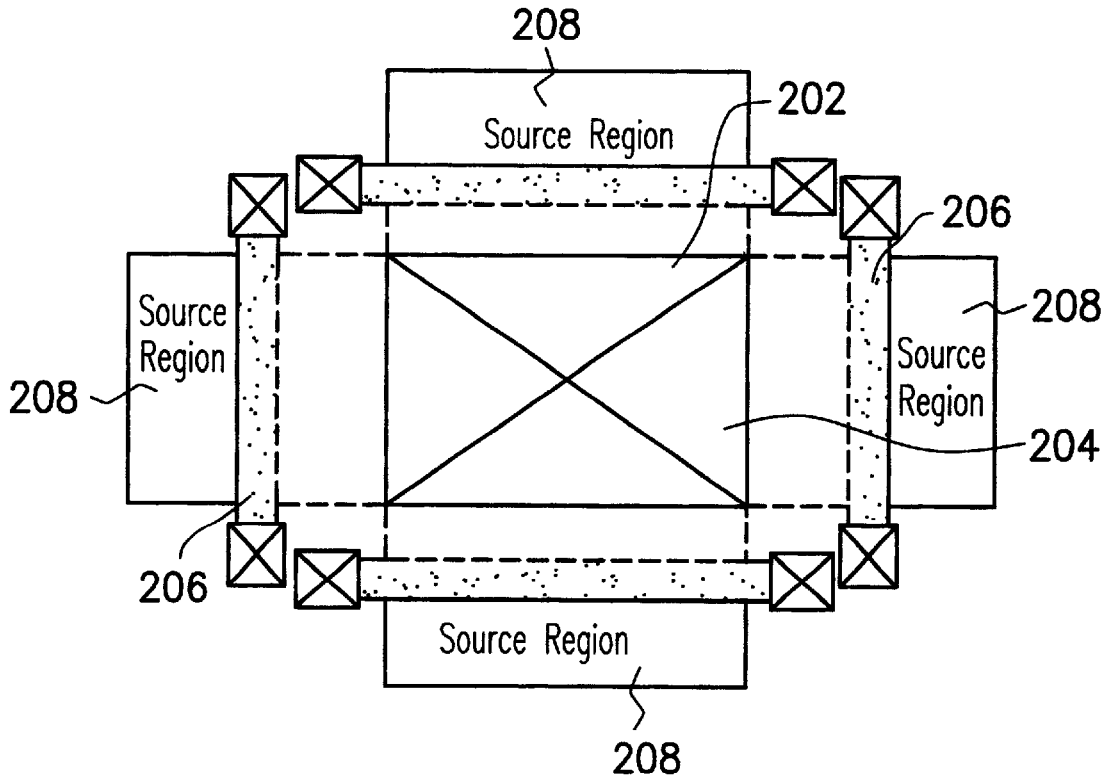
FIG. 2 is a top view of an electrostatic discharge protection apparatus in a second embodiment according to the invention.

FIG. 2 shows a second embodiment of an electrostatic discharge protection apparatus according to the invention. The electrostatic discharge protection apparatus comprises a pad 202, a drain region 204, gates 206 and source regions 208. The drain region is located under the pad 202. The gates 206 are located at a periphery of the pad 202. The gates comprise polysilicon gates or gates made of other metal or conductive material. One source region 208 is located around each of the gates 206.

In FIG. 2, the drain region 204, the gates 206 and the source regions 208 together form a transistor, for example, an NMOS transistor or a PMOS transistor.

Figure 3:
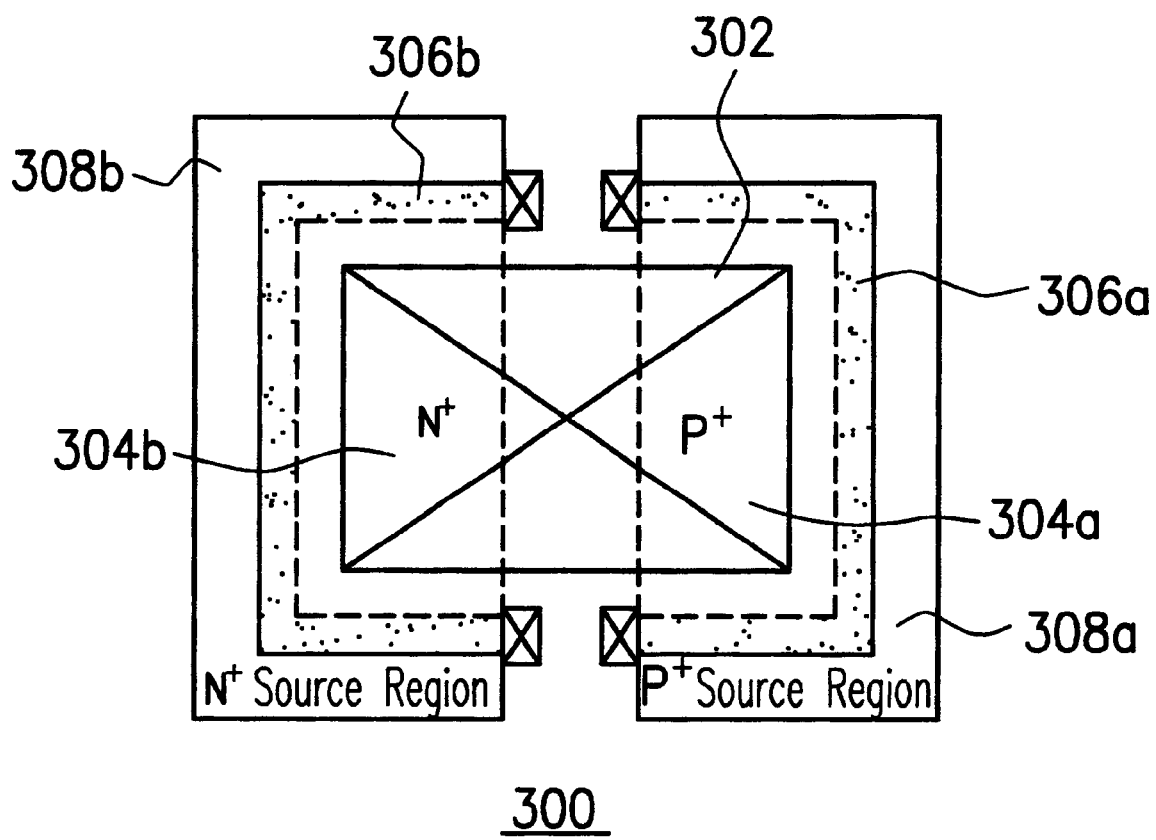
FIG. 3 is a top view of an electrostatic discharge protection apparatus in a third embodiment according to the invention.

FIG. 3 shows an electrostatic discharge protection apparatus in the third embodiment according to the invention. The electrostatic discharge protection apparatus 300 as shown in FIG. 3 comprises a pad 302, a heavily doped P-type (P$^+$) drain region 304a and a heavily doped N-type (N⁺) drain region 304b. Around the portion of the pad 302 covering the P⁺ drain region 304a and the portion of the pad 302 covering the N⁺ drain region, gates 306a and 306b are respectively formed. The gates 306a and 306b comprise polysilicon gates. In addition, around both the gates 306a and 306b, a P⁺ source region 308a and an N⁺ source region 308b are located respectively.

In FIG. 3, the drain region 304a, the gate 306a and the source region 308a together form a PMOS transistor, while the drain region 304b, the gate 306b and the drain region 308b together form an NMOS transistor.

The electrostatic discharge protection apparatus of the first, second and third is formed with a area much smaller than the area used by the conventional electrostatic discharge protection apparatus without degrading the electric and protection performance.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An electrostatic discharge protection apparatus, comprising:
   a pad;
   a drain region, under the pad;
   a gate, located at a periphery of the pad, wherein the gate surrounds the pad; and
   a source region, at a periphery of the gate, wherein the source region surrounds the gate.

2. The protection apparatus according to claim 1, wherein the gate comprises a polysilicon gate.

3. The protection apparatus according to claim 1, wherein the drain region, the gate and the source region together form either a PMOS transistor or an NMOS transistor.

4. An electrostatic discharge protection apparatus, comprising:
   a pad;
   a drain region, covered by the pad;
   a plurality of gates, located around a periphery of the pad; and
   a plurality of source regions, wherein each of the source regions with respect to the gates is located at an outer periphery of the gates.

5. The protection apparatus according to claim 4, wherein the gates comprise polysilicon gates.

6. The protection apparatus according to claim 4, wherein the drain region, one of the gates and one of the source regions surrounding the gates together form either a PMOS transistor or an NMOS transistor.

7. An electrostatic discharge protection, comprising:
   a pad, divided into a first portion and a second portion;
   a heavily doped P-type drain region, located under the first portion of the pad;
   a heavily doped N-type drain region, located under the second portion of the pad;
   a first gate, around an outer periphery of the first portion of the pad;
   a second gate, around an outer periphery of the second portion of the pad;
   a heavily doped P-type source region, around an outer periphery of the first gate; and
   a heavily doped N-type source region, around an outer periphery of the second gate.

8. The protection apparatus according to claim 7, wherein the first and second gates comprise polysilicon gates.

9. The protection apparatus according to claim 1, wherein the drain region has an area substantially equal to an area of the pad.

10. The protection apparatus according to claim 4, wherein the drain region has an area substantially equal to an area of the pad.

11. The protection apparatus according to claim 7, wherein an area of the heavily doped P-type drain region is about equal to an area of the first portion of the pad, and an area of the heavily doped N-type drain region is about equal to an area of the second portion of the pad.

* * * * *